United States Patent [19]
Wagner et al.

[11] Patent Number: 6,157,539
[45] Date of Patent: Dec. 5, 2000

[54] COOLING APPARATUS FOR ELECTRONIC DEVICES

[75] Inventors: Guy R. Wagner, Loveland; Steven E. Hanzlik, Fort Collins, both of Colo.

[73] Assignee: Agilent Technologies, Palo Alto, Calif.

[21] Appl. No.: 09/373,664

[22] Filed: Aug. 13, 1999

[51] Int. Cl.[7] .................................................. H05K 7/20
[52] U.S. Cl. .......................... 361/704; 361/687; 361/692; 361/695; 361/727; 257/713; 257/717; 257/726; 165/80.3; 165/121; 165/185; 174/16.3; 174/252; 415/178
[58] Field of Search ........................ 361/690, 702–710, 361/717–722, 687–689, 692–698, 727, 683; 174/16.3, 15.2, 252, 254, 260, 15.1, 16.1; 257/706–727; 165/80.3, 125, 185, 80.4, 121, 122; 415/178, 211.1, 211.2, 177, 208.4, 186

[56] References Cited

U.S. PATENT DOCUMENTS

| | | | |
|---|---|---|---|
| 4,715,438 | 12/1987 | Gabusda et al. | 165/185 |
| 5,019,880 | 5/1991 | Higgins | 357/81 |
| 5,445,215 | 8/1995 | Herbeert | 165/80.3 |
| 5,484,262 | 1/1996 | Thomas et al. | 415/178 |
| 5,650,912 | 7/1997 | Katsui et al. | 361/697 |
| 5,782,292 | 7/1998 | Ogawara et al. | 165/80.3 |
| 5,785,116 | 7/1998 | Wagner | 165/80.3 |
| 5,794,685 | 8/1998 | Dean | 165/121 |
| 5,896,917 | 4/1999 | Lemont et al. | 165/80.3 |
| 5,901,039 | 5/1999 | Dehaine et al. | 361/704 |
| 5,957,659 | 9/1999 | Amou et al. | 415/178 |
| 5,992,511 | 11/1999 | Kodaira et al. | 165/80.3 |

FOREIGN PATENT DOCUMENTS

| | | | |
|---|---|---|---|
| 407312492 | 11/1995 | Japan | H05K 7/20 |
| 409275290 | 10/1997 | Japan | H05K 7/20 |
| 410154889 | 6/1998 | Japan | H05K 7/20 |

*Primary Examiner*—Leo P. Picard
*Assistant Examiner*—Michael Datskovsky

[57] ABSTRACT

A cooling system for dissipating heat from a heat source is disclosed. The cooling system comprises a heat sink associated with a divider member. The heat sink includes a heat conductive base portion having a surface adapted to contact the heat source. The base portion has a peripheral wall member extending from the heat conductive base portion wherein the peripheral wall member defines a chamber therewithin and a heat sink device exterior located on the opposite side of the peripheral wall member from the chamber. A plurality of openings extend through the peripheral wall member between the heat sink device exterior and the chamber. An intake airflow path extends from the heat sink device exterior through a first portion of the plurality of openings to the chamber. An exhaust airflow path extends from the chamber through a second portion of the plurality of openings to the heat sink device exterior. A divider member is positioned adjacent the exterior of the heat sink device and separates the intake and exhaust airflow paths.

24 Claims, 7 Drawing Sheets

COOLING APPARATUS FOR ELECTRONIC DEVICES

FIELD OF THE INVENTION

The present invention relates generally to cooling devices and, more particularly, to a cooling device for removing heat from an electronic device.

BACKGROUND OF THE INVENTION

Electronic devices, such as integrated circuits, are increasingly being used in different applications. One prevalent example of an application using integrated circuits is the computer. The central processing unit or units of most computers, including personal computers, is typically constructed from a plurality of integrated circuits.

During normal operation, many electronic devices generate significant amounts of heat. If this heat is not continuously removed, the electronic device may overheat, resulting in damage to the device and/or a reduction in operating performance. For example, the electronic device may encounter thermal runaway, with may damage the electronic device. In order to avoid such problems caused by overheating, cooling devices are often used in conjunction with electronic devices.

Over the years, the power of many electronic devices has increased along with the amount of heat generated by these devices. In addition, the size of electronic devices has generally decreased, resulting in greater amounts of heat being generated within smaller confines. In order to adequately cool these higher powered electronic devices without increasing their size, more efficient cooling devices and cooling devices with greater cooling capacities are required.

One such cooling device used in conjunction with electronic devices is a fan assisted heat sink. In such a device, a heat sink is formed from a material, such as aluminum, which readily conducts heat. The heat sink is usually placed on top of, and in physical contact with, the electronic device. The physical contact improves the thermal conductivity between the electronic device and the heat sink. Fasteners, such as screws, are often used to secure the heat sink to the electronic device, which maintains thermal conductivity between the electronic device and the heat sink. In addition, a thermally conductive compound is typically placed between the electronic device and the heat sink to enhance to heat transfer from the electronic device to the heat sink. This thermal conductivity results in heat generated by the electronic device being conducted into the heat sink and away from the electronic device. The heat in the heat sink is then dissipated into the surrounding atmosphere.

One method of increasing the cooling capacity of these heat sinks is by including a plurality of cooling fins that are physically connected to the heat sink. These fins serve to increase the surface area of the heat sink and, thus, maximize the transfer of heat from the heat sink to the surrounding atmosphere. In this manner, the heat sink draws heat away from the electronic device and transfers the heat into the surrounding air. An example of a heat sink is disclosed in U.S. Pat. No. 5,794,685 of Dean for HEAT SINK DEVICE HAVING RADIAL HEAT AND AIRFLOW PATHS and U.S. patent application Ser. No. 09/253877 of Hanzlik, et al. for COOLING APPARATUS FOR ELECTRONIC DEVICES, both of which are hereby incorporated by reference for all that is disclosed therein.

In order to further enhance the cooling capacity of a heat sink device, an electrically powered fan is often mounted within or on top of the heat sink. In operation, the fan forces air to move past the fins of the heat sink, thus, cooling the fins by enhancing the transfer of heat from the fins into the surrounding atmosphere. As the fins are cooled, heat can be drawn from the electronic device and into the heat sink at a faster rate. The fan typically draws air into the heat sink from the top of the heat sink, passes the air over the fins, and exhausts the air from the heat sink in the vicinity of the bottom of the heat sink. Accordingly, the exhaust air is hotter than the intake air. The operation and airflow of a heat sink device including a fan may, as an example, be described in U.S. Pat. No. 5,785,116 of Wagner for FAN ASSISTED HEAT SINK DEVICE, which is hereby incorporated by reference for all that is disclosed therein.

Two problems have been encountered with fan assisted heat sinks. The first problem is that the vibration of the fan coupled with the thermal expansions and contractions of the heat sink and the heat generating device break down the thermal conductivity between the heat sink and the heat generating device. Specifically, the heat sink and the electronic device expand and contract at different rates, which causes them to physically move relative to each other. The differing rate of expansion and contraction may cause a portion of the heat sink to separate from the electronic device causing the breakdown of the thermal conductivity between the heat sink and the electronic device. This breakdown results in the heat sink becoming much less efficient. Furthermore, this expansion and contraction may result in the thermal conductivity through the thermally conductive compound becoming disrupted, which further decreases the efficiency of the cooling device.

The second problem encountered with fan assisted heat sinks is due to air recirculating through the heat sink. In operation, cool air is drawn into the heat sink from the top of the heat sink across the top portion of the cooling fins. This air is then exhausted from the heat sink by directing the air across the bottom portion of the cooling fins. This circulation of air cools the entire heat sink. Under ideal conditions, the hot air exhausted from the heat sink is blown away from the heat sink and only cool air is drawn into the heat sink. Under many circumstances, however, the hot exhaust air disperses as it exits the heat sink. Some of this dispersed air then circulates up to the top of the heat sink rather than being blown away from the heat sink. This hot exhaust air is then drawn back into the heat sink by the force of the fan, which heats the air being drawn into the heat sink for cooling purposes. As this cycle repeats, this recirculating of exhaust air prevents efficient cooling of the heat sink because relatively hot air, not cool air, is being drawn across the fins.

Thus, it would be generally desirable to provide an apparatus and method which overcome these problems associated with cooling devices.

SUMMARY OF THE INVENTION

A cooling device for cooling heat generating devices, such as integrated circuits or other devices, is disclosed herein. The cooling device may include a heat sink portion having a chamber formed therein, a base portion, and a plurality of fins. The plurality of fins may have inner sides, outer sides, upper portions and lower portions. The lower portions of the fins may be affixed to the base portion of the heat sink and the upper portions of the fins may be located opposite the lower portions. The placement of the fins on the base portion forms the chamber wherein the chamber is defined by the inner sides of the fins. The outer sides of the fins may form a peripheral wall of the heat sink. Openings that serve as air passages may be formed between the fins and may extend between the chamber and the peripheral wall. The openings may have upper portions and lower portions that correspond to the upper portions and lower portions of the fins respectively. The base portion of the heat sink opposite the fins is located adjacent the heat generating device.

The chamber may have a lower portion that is adjacent the base portion of the heat sink and, accordingly, may be closed. The chamber may also have an upper portion, which may be located opposite the chamber lower portion and may be open to the exterior of the heat sink. The chamber may be appropriately shaped to accommodate a fan or other type of air circulating device. For example, the chamber may be cylinder shaped so as to accommodate a rotating fan.

The heat sink cools the heat generating device by conducting heat from the heat generating device, through the base portion, and into the fins. The fins then convect the heat into the surrounding atmosphere. Accordingly, the lower portions of the fins are hotter than the upper portions. The function of the heat sink is enhanced by circulating air through the openings past the fins. Relatively cool air is drawn from outside the peripheral wall, through the upper portions of the openings and into the chamber. The air is then exhausted from the heat sink by being forced from the chamber through the lower portions of the openings and out the peripheral wall of the heat sink. The air exhausted from the heat sink has convected heat from the fins and is hotter than the air drawn into the heat sink. The circulating air creates an intake air path through the upper portions of the openings and an exhaust air path through the lower portions of the openings. The air in the intake air path is cooler than the air in the exhaust air path.

An air diverter is located adjacent the peripheral wall of the heat sink between the intake air path and the exhaust air path. The air diverter may be a planar member that serves to separate the air in the intake air path from air in the exhaust air path. The air diverter, thus, prevents the relatively hot exhaust air from being mixed with the relatively cool intake air. Accordingly, the cooling capability of the heat sink is increased by separating these air paths.

The air diverter may also serve as a mounting bracket for the heat sink. Fasteners, e.g., screws, may fasten the air diverter to the heat source. The fasteners may be spring loaded, thus, the heat sink may contact the heat source via a spring force. Alternatively, the air diverter may be fabricated from a flexible material. The fasteners will then deflect the air diverter, creating a spring force by virtue of the deflection which, in turn, causes the heat sink to contact the heat source. This spring force assures that the heat sink maintains contact with the heat source as both the heat sink and the heat source undergo thermal expansion and contraction.

DETAILED DESCRIPTION OF THE INVENTION

Figure 1:
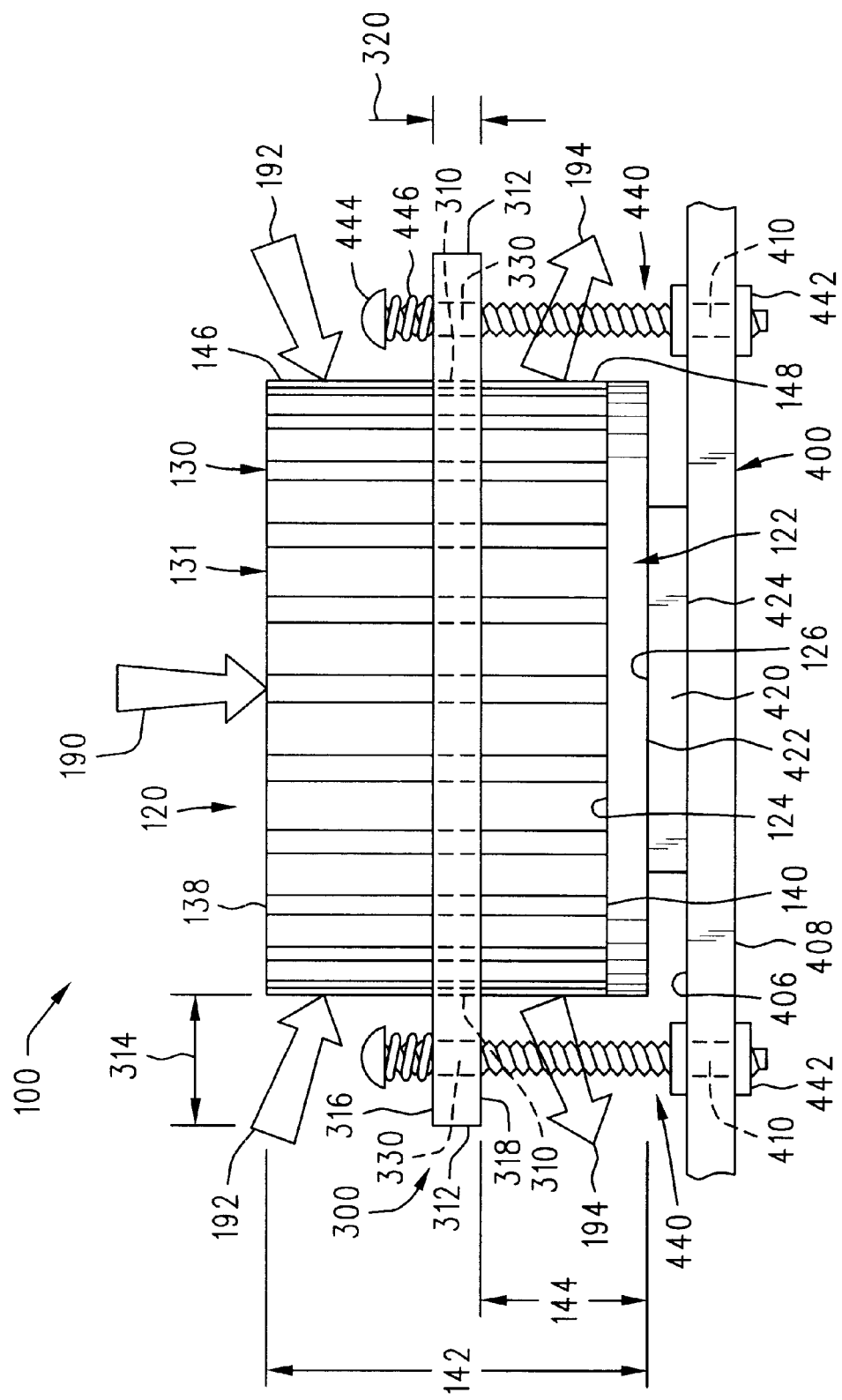
FIG. 1 is a side view of a cooling device comprising a heat sink with an air diverter attached thereto.

FIGS. 1 through 5, in general, illustrate a cooling system 100 for dissipating heat from a heat source 420. The cooling device 100 comprises: a heat sink device 120 including: a) a heat conductive base portion 122 having a surface 126 adapted to contact the heat source 420; b) a wall member 130 (sometimes referred to herein as "fins") extending from the heat conductive base portion 120; c) the wall member 130 defining a chamber 110 therewithin and a heat sink device exterior 134 located on the opposite side of the wall member 130 from the chamber 110; d) a plurality of openings 131 extending through the peripheral wall member 130; e) the plurality of openings 131 extending between the heat sink device exterior 134 and the chamber 110; an intake airflow path 192 extending from the heat sink device exterior 134 through a first portion 146 of the plurality of openings 131 to the chamber 110; an exhaust airflow path 194 extending from the chamber 110 through a second portion 148 of the plurality of openings 131 to the heat sink device exterior 134; and a divider member 300 including: a) a first surface 316 facing the intake airflow path 192; and b) a second surface 318 oppositely disposed relative to the first surface 316, the second surface 318 facing the exhaust airflow path 194; wherein the divider member 300 separates the intake and exhaust airflow paths 192, 194.

FIGS. 1 through 5 also, in general, illustrate a method of dissipating heat from a heat source 420. The method comprises: providing a heat sink device 120 including: a) a heat conductive base portion 122 having a surface 126 adapted to contact the heat source 420; b) a wall member 130 extending from the heat conductive base 122 portion; c) the wall member 130 defining a chamber 110 therewithin and a heat sink device exterior 134 located on the opposite side of the wall member 130 from the chamber 110; d) a plurality of openings 131 extending through the wall member 130; e) the plurality of openings 131 extending between the heat sink device exterior 134 and the chamber 110; conducting heat from the heat source 420 through the heat conductive base portion 122 and into the wall member 130; removing heat from the wall member 130 by moving air along an intake airflow path 192 into the heat sink device chamber 110 from the heat sink device exterior 134 through a first portion 146 of the plurality of openings 131; removing additional heat from the wall member 130 by moving air along an exhaust airflow path 194 out of the heat sink device chamber 110 through a second portion 148 of the plurality of openings 131 to the heat sink device exterior 134; providing a divider member 300 including: a) a first surface 316 facing the intake airflow path 192; and b) a second surface 318 oppositely disposed relative to the first surface 316, the second surface 318 facing the exhaust airflow path 194; and separating the intake and exhaust airflow paths 192, 194 with the divider member 300.

FIGS. 1 through 5 also, in general, illustrate an attachment mechanism 300 for securing a cooling device 100 to a substrate 400 wherein the cooling device 100 is of the type comprising a base portion 122 adapted to contact a heat source 420. The base portion 122 has a plurality of heat conductive members 130 extending from the base portion 122. The plurality of heat conductive members 130 are arranged to form a wall of the cooling device 100. The attachment mechanism 300 comprises: a divider member 300 having a first surface 316 and a second surface 318 opposite the first surface 316. The divider member 300 has a cutout between the first surface 316 and the second surface 318, the cutout has a perimeter 310 that is substantially the same shape as the wall, however, the perimeter 310 has a size greater than the peripheral wall. The divider member 300 is adjacent the exterior wall of the cooling device 100.

Having generally described the cooling device 100, it will now be described in greater detail. In summary, the cooling device 100 illustrated in FIG. 1 serves to remove heat from a heat generating source 420 in a two stage process. First, the cooling device 100 draws the heat from the heat generating source into a heat sink 120. The heat is then conducted to a plurality of fins 130 where it is convected into the surrounding atmosphere. In the second stage, air is passed by the fins 130 to enhance the convection of the heat into the surrounding atmosphere. The cooling capability of the cooling device 100 is further enhanced by the addition of an air diverter 300 that serves to keep hot exhaust air from recirculating into the cooling device 100. Thus, only relatively cool air is drawn across the fins 130.

The cooling device 100 illustrated in FIG. 1 is depicted as removing heat from an integrated circuit 420 by drawing heat from a top surface 422 of the integrated circuit into the heat sink 120 of the cooling device 100. The heat sink 120 has a plurality of fins 130 attached thereto that serve to convect the heat into the surrounding atmosphere. As the heat is convected from the fins 130, more heat is drawn from the integrated circuit 420, which, in turn, further cools the integrated circuit 420. The heat sink 120 further convects heat into the surrounding atmosphere by the use of a fan, not shown in FIG. 1 that draws air into the heat sink 120 via a top intake air path 190 and a side air intake path 192. Air in the side air intake path 192 passes over top portions 146 (sometimes referred to herein as first portions) of the plurality of fins 130 and into a cavity 110, FIG. 2. Air is exhausted from the cavity 110 and, thus, the heat sink 120, via an exhaust air path 194, FIG. 1, wherein the exhaust air passes over lower portions 148 (sometimes referred to herein as second portions) of the fins 130 and into the surrounding atmosphere. The lower portions 148 of the fins 130 are closer to the integrated circuit 420, which makes them hotter than the upper portions 146. Accordingly, the air in the exhaust air path 194 is hotter than the air in the top intake air path 190 and the air in the side intake air path 192.

In conventional cooling devices, the hot exhaust air from the heat sink disperses randomly into the surrounding atmosphere upon exiting the heat sink. Likewise, the air in the side intake air path 192 is randomly drawn from the surrounding atmosphere, which is air in close proximity to the heat sink 120. Accordingly, the hot exhaust air in the exhaust air path 194 can recirculate into the side intake air path 192, causing relatively hot air to be drawn into the heat sink 120 for cooling purposes. This recirculation substantially decreases the cooling capability of the conventional cooling device.

Furthermore, conventional cooling devices are generally rigidly associated with the heat generating devices that they are cooling. As the heat generating devices and the conventional cooling devices undergo thermal expansion and contraction, the thermal conductivity between the heat generating devices and the conventional cooling devices deteriorates. For example, physical contact between a heat generating device and a conventional cooling device may decrease, which causes the thermal conductivity between the conventional cooling device and the heat generating device to deteriorate. This deterioration further decreases the cooling capability of the conventional cooling devices.

The cooling device 100 illustrated herein overcomes the aforementioned problems of conventional cooling devices by the use of an air diverter 300 (sometimes referred to herein as a divider member). The air diverter 300 serves to separate the side intake air path 192 from the exhaust air path 194. Thus, hot exhaust air is not drawn into the cooling device 100. In addition, the air diverter 300 is attached to the printed circuit board 400 by a spring force. Because the integrated circuit 420 is also attached to the printed circuit board 400, the top surface 422 of the integrated circuit 420 is, likewise, attached to the cooling device 100 by the use of the spring force. This spring force serves to assure that the heat sink 120 remains in physical contact with the integrated circuit 420 as both the integrated circuit 420 and the heat sink 120 undergo thermal expansion and contraction. This constant physical contact assures that thermal conductivity between the integrated circuit 420 and the heat sink 120 is maintained.

Having summarily described the cooling device 100, it will now be described in greater detail. The cooling device 100 may have two primary components, a heat sink 120 and an air diverter 300. Several embodiments of the heat sink 120 and the air diverter 300 may be used in the cooling device 100. The following description, however, focuses on the heat sink 120 and air diverter 300 illustrated in FIGS. 1 and 2 with descriptions of other embodiments of the heat sink 120 and air diverter 300 following this description. The heat sink 120 may be fabricated from a material or combination of materials that conduct heat, such as aluminum or other metals. Likewise, the air diverter 300 may be fabricated from a material or combination of materials that conduct heat, although, thermal conductivity of the air diverter 300 is not as important as with the heat sink 120. Additionally, the air diverter 300 may be fabricated from a material that is flexible and, thus, deflects so as to function as a spring mechanism.

Figure 2:
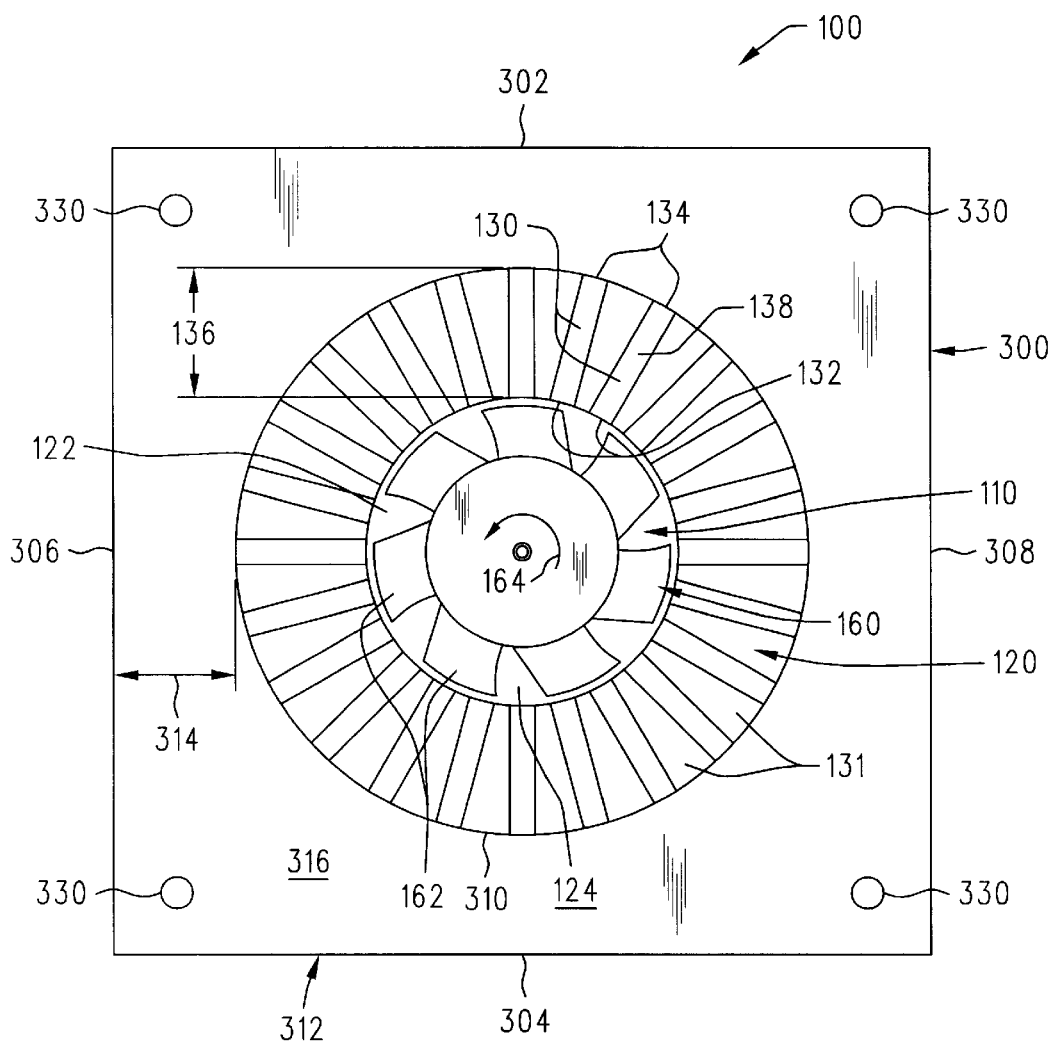
FIG. 2 is a top view of the cooling device of FIG. 1.

Referring to FIGS. 1 and 2, the heat sink 120 may have a base portion 122 with a plurality of fins 130 affixed thereto. The base portion 122 may be fabricated from a material that conducts heat from the integrated circuit 420 to the fins 130. The base portion 122 may have an upper side 124 and a lower side 126 wherein the fins 130 are affixed to the upper side 124 so as to facilitate the transfer of heat from the base portion 122 to the fins 130. The lower side 126 is illustrated herein as being substantially planar, however, the lower side 126 may be appropriately shaped to match the surface of the object to which the heat sink 120 is associated. The lower surface 126 illustrated in FIG. 1 is appropriately shaped to contact a surface of the integrated circuit 420.

The fins 130 may be vertical vanes wherein openings 131 may be present between the fins 130. As will be described below, air may be forced through the openings 131 between the fins 130 so as to convect heat from the fins 130 and, thus, cool the heat sink 120. Each fin 130 may have an inner side 132, an outer side 134, a top side 138, and a bottom side 140. Each fin 130 may also have an upper portion 146 and a lower portion 148. As will be described below, the upper portion 146 and the lower portion 148 are defined by the placement of an air diverter 300 relative to the fins 130 and the relative air flows through the fins 130. The fins 130 may have a height 142 extending between the top side 138 and the bottom side 140. The fins 130 may also have a length 136 extending between the inner side 132 and the outer side 134. The bottom side 140 of the fins 130 may contact the base portion 122 so as to conduct heat from the base portion 122 to the fins 130. The fins 130 are illustrated herein as extending perpendicular to the base portion 122. It is to be understood, however, that the fins 130 may extend in other directions relative to the base portion 122. For example, the fins 130 may intersect the base portion 122 at an angle as illustrated in U.S. Pat. No. 5,785,116 of Wagner, previously referenced.

The fins 130 may be arranged on the top portion 124 of the heat sink 120 so as to form a wall member, which defines a cavity 110 (sometimes referred to herein as a chamber). Specifically, the inner sides 132 of the fins 130 may be arranged to form a peripheral wall of the cavity 110, which defines the boundaries of the cavity 110. The cavity 110 is illustrated herein as being in the shape of a cylinder. A cylindrical shape of the cavity 110 permits a rotating fan 160 to be located within the cavity 110. The fan 160 may have a plurality of fins 162 associated therewith and may rotate in a direction 164. Accordingly, the fan may rotate in close proximity to the inner sides 132 and may serve to circulate air through openings 131 past the fins 130. The outer sides 134 of the fins 130 form an exterior peripheral wall of the heat sink 120, which defines the exterior of the heat sink 120. The exterior of the heat sink 120 defined by the outer sides 134 of the fins 130 may, as an example, have a diameter of approximately 90 millimeters. The exterior peripheral wall of the heat sink 120 is illustrated herein as being cylindrical, however, it is to be understood, that the exterior peripheral wall may have other shapes depending on the application of the cooling device 100.

The air diverter 300 (sometimes referred to herein as a divider member) may be located adjacent the outer sides 134 of the fins 130. The air diverter 300 may, as an example, be integrally formed in the cooling device 100 or it may be welded to the outer sides 134 of the fins 130. The air diverter 300 illustrated in FIGS. 1 and 2 is square shaped and has an upper side 302, a lower side 304, a left side 306 and a right side 308. The boundaries of the upper side 302, lower side 304, left side 306, and right side 308 define an outer perimeter 312 of the square shape of the air diverter 300. Each side may, as an example, be approximately 130 millimeters long. It is to be understood, that the square shape of the air diverter 300 is for illustration purposes only and that the air diverter 300 may have other shapes depending on the application of the cooling device 100. The air diverter 300 may have a hole formed therein that is defined by an inner perimeter 310. A width 314 may be the shortest distance between the inner perimeter 310 and the outer perimeter 312. The air diverter 300 may have a top surface 316 and a bottom surface 318 wherein the top surface 316 is separated from the bottom surface 318 by a width 320, FIG. 2. The air diverter 300 may also have a plurality of holes 330, FIG. 2, that may serve to secure the cooling device 100 to a printed circuit board 400 as will be described below.

The air diverter 300 is positioned adjacent the heat sink 120 so that the bottom surface 318 of the air diverter 300 is located a distance 144, e.g, approximately 35 millimeters, from the lower surface 126 of the base portion 122. The top surface 316 of the air diverter 300 may be positioned approximately 20 millimeters from the top sides 138 of the fins 130. The portion of the fins 130 located between the bottom surface 318 of the air diverter 300 and the base portion 122 is defined herein as being the lower portion 148 of fins 130. The portion of the fins 130 located between the top surface 316 of the air diverter 300 and the top side 138 of the fins 130 is defined herein as being the upper portion 146 of the fins 130. As will be described below, the upper portion 146 and lower portion 148 of the fins 130 are used to differentiate between hot air and cool air that is forced through the openings 131.

The cooling device 100 is illustrated herein as being used to conduct heat away from an integrated circuit 420, thus, cooling the integrated circuit 420. The integrated circuit 420 may be mounted to the printed circuit board 400 in a conventional manner, i.e., it may be soldered to the printed circuit board 400 or placed into a socket. The integrated circuit 420 may have a top side 422 and a bottom side 424. The top side 422 may be adapted to contact the lower surface 126 of the base portion 122 of the heat sink 120 so as to conduct heat from the top side 422 of the integrated circuit 420 to the cooling device 100. A conventional thermal conductive compound may be located between the top side 422 of the integrated circuit 420 and the lower surface 126 of the heat sink 120 to facilitate the transfer of heat from the integrated circuit 420 to the cooling device 100.

The printed circuit board 400 may have an upper surface 406 and a lower surface 408. The bottom side 424 of the integrated circuit 420 may face the upper surface 406 of the printed circuit board 400. A plurality of holes 410 may pass through the printed circuit board 400 and may be positioned relative to each other in the same manner as the holes 330 in the air diverter 300 are positioned relative to each other. Screws 440 may pass through the holes 330 in the air diverter 300 and the holes 410 in the printed circuit board 400. Each screw 440 may have a conventional head 444 positioned proximate the top surface 316 of the air diverter 300. A coil spring 446 may be positioned around the screw 440 between the head 444 and the top surface 316 of the air diverter 300 so as to force the head 444 and the air diverter 300 apart. A conventional nut 442 may be threaded onto the screw 440 so as to abut the lower surface 408 of the printed circuit board 400. The combinations of the screws 440, nuts 442, and springs 446 (sometimes referred to herein as spring mechanisms) may serve to bias the cooling device 100 onto the integrated circuit 420. Accordingly, the cooling device 100 physically contacts the integrated circuit 420 by use of a spring force. As will be described below, this spring force maintains the transfer of heat from the integrated circuit 420 to the cooling device 100 as both undergo thermal expansion and contraction.

Having described the components comprising the cooling device 100, it will now be described cooling the integrated circuit 420 mounted to the printed circuit board 400.

In the cooling device 100 described below, the air diverter 300 is integrally formed with the heat sink 120. For example, they may be cast as a single unit or fabricated as separate units and welded together. Other embodiments of attaching the air diverter 300 to the heat sink 120 are described further below.

The cooling device 100 is placed onto the integrated circuit 420 by the use of the screws 440, the nuts 442 and the springs 446. Specifically, the springs 446 are placed around the screws 440 so that the springs 446 abut the heads 444. The screws 440 are placed through the holes 330 in the air diverter 300 so that the springs 446 abut the top surface 316 of the air diverter 300. Thus, the springs 446 abut the heads 444 of the screws 440 and the top surface 316 of the air diverter 300. The screws 440 are then placed through the holes 410 in the printed circuit board 400. The nuts 442 are threaded onto the screws 440 to secure the cooling device 100 to the printed circuit board 400 so that the lower surface 126 of the base portion 122 of the heat sink 120 contacts the top side 422 of the integrated circuit 420. As the nuts 442 are threaded onto the screws 440, the springs 446 compress causing a spring force to be applied between the heat sink 120 and the integrated circuit 420. This spring force will remain substantially constant as both the heat sink 120 and the integrated circuit 420 experience thermal expansion and contraction. Thus, the heat sink 120 will always contact the integrated circuit 420 and heat will continually radiate from the integrated circuit 420 to the heat sink 120 even if the integrated circuit 420 and the heat sink 120 expand and contract differently.

In conventional cooling devices, the heat sink is rigidly attached to the printed circuit board. Accordingly, the conventional heat sink is located in a fixed position relative to the integrated circuit. Alternatively, the heat sink is rigidly attached directly to an integrated circuit or other heat generating device. For example, the heat sink may be epoxied to the integrated circuit. As both the heat sink and the integrated circuit absorb and dissipate heat, they undergo thermal expansion and contraction, which is usually at different rates. This thermal expansion and contraction presents problems because the heat sink is rigidly attached to the integrated circuit. For example, the thermal expansion and contraction may cause the heat sink to move relative to the integrated circuit. This, in turn, may break the physical contact between the heat sink and the integrated circuit, causing the thermal contact between the devices to deteriorate.

The cooling device 100 described above overcomes these problems by using a spring force, as described above, to attach the cooling device 100 to the integrated circuit 420. Accordingly, as the cooling device 100 and the heat sink 120 undergo thermal expansion and contraction, the spring force maintains the physical and, thus, thermal contact, between the cooling device 100 and the integrated circuit 420.

When in use, the integrated circuit 420 generates heat, which needs to be removed in order to assure proper operation of the integrated circuit 420. A substantial portion of this heat is conducted into the base portion 122 of the heat sink 120 by virtue of the physical contact between the base portion 122 and the top side 422 of the integrated circuit 420. Specifically, the heat passes from the top side 422 of the integrated circuit 420 through the thermally conductive compound, not shown, and into the base portion 122 of the integrated circuit 420. The heat then passes into the fins 130. The fins 130 serve to increase the area of the heat sink 120 that convects heat, thus, increasing the cooling capability of the cooling device 100.

A conventional rotating fan, not shown, may be located in the cavity 110. The fan serves to draw cool air into the heat sink 120 and exhaust hot air from the heat sink 120. While the air drawn into the heat sink 120 will serve to cool the base portion 122, its primary purpose is to pass through the openings 131, which convects heat from the fins 130 and, thus, cools the fins 130. The fan creates three air paths that are illustrated herein. A top intake air path 190 is an air path originating from the exterior of the cooling device 100 above the cavity 110 and terminating in the cavity 110. A side intake air path 192 originates from the exterior of the cooling device 100 adjacent the top surface 316 of the air diverter 300 and passes through the openings 131, past the upper portions 146 of the fins 130 and terminates in the cavity 110. An exhaust air path 194 originates in the cavity 110 and passes through the openings 131, past the lower portions 148 of the fins, and under the air diverter 300. The exhaust air path 194 terminates adjacent the bottom surface 318 of the air diverter 300 and is substantially parallel to the intake air path 192. Accordingly, the air in the exhaust air path 194 is the cumulation of the air in the top intake air path 190 and the side intake air path 192. The air in the exhaust air path 194 is hotter than the air in the top intake air path 190 and the side intake air path 192 because it has convected heat from the lower portions 148 of the fins 130, which are relatively hot due to their close proximity to the integrated circuit 420.

The cooling process is twofold. Heat is drawn from the integrated circuit 420 into the heat sink 120 where it passes into the fins 130. The fins 130 then convect the heat into the surrounding atmosphere. Due to the close proximity of the lower portions 148 of the fins to the integrated circuit 420, they tend to be hotter than the upper portions 146. The convection of heat from the integrated circuit 420 is enhanced by the use of the fan. Cool air is drawn from the exterior of the integrated circuit 420 across the upper portions 146 of the fins 130 and into the cavity 110. The air is then exhausted over the lower portions 148 of the fins 130 via the exhaust air path 194. This exhaust air further convects heat from the fins 130.

The air diverter 300 separates the relatively hot air in the exhaust air path 194 from the relatively cool air in the top intake air path 190 and, more particularly, from the relatively cool air in the side intake air path 192. The air diverter 300 directs the hot air in the exhaust air path 194 in a direction that is substantially parallel to the air diverter 300. The hot exhaust air is, thus, directed away from the heat sink 120 so as to prevent the hot air from being drawn into the side intake air path 192 and, thus, into the heat sink 120. Likewise, the air diverter 300 directs the side intake air path 192 to be substantially parallel to the air diverter 300, which keeps the side intake air path 192 from drawing exhaust air into the heat sink 120. Accordingly, as the area of the air diverter 300 is increased, it will better separate the air in the side intake air path 192 from the air in the exhaust air path 194. Without the use of the air diverter 300, the hot air in the exhaust air path 194 will disperse upon being exhausted from the heat sink 120. The dispersed hot air is then able to circulate into the side intake air path 192, which causes the hot air to be drawn back into the heat sink 120. This hot air drawn into the heat sink 120 decreases the cooling capability of the heat sink 120.

Having described the function of the cooling device 100 illustrated in FIGS. 1 and 2, other embodiments of the cooling device 100 will now be described.

The cooling device 100 has been illustrated as being attached to the printed circuit board 400 by the use of the screws 440, nuts 442, and springs 446. This attachment causes a spring force to be applied between the cooling device 100 and the printed circuit board 400. In one embodiment of the cooling device 100, the air diverter 300 is fabricated from a relatively flexible and sturdy material that deflects slightly when a force is applied to it. In this embodiment, the springs 446 are eliminated and the spring force between the cooling device 100 and the printed circuit board 400 is created by the deflection of the flexible air diverter 300. The flexibility and, thus, the deflection of the air diverter 300 may be established by the size, thickness 320, and material comprising the air diverter 300 as are known in the art. This embodiment has advantages in some applications by eliminating the need for the springs 446.

Figure 3:
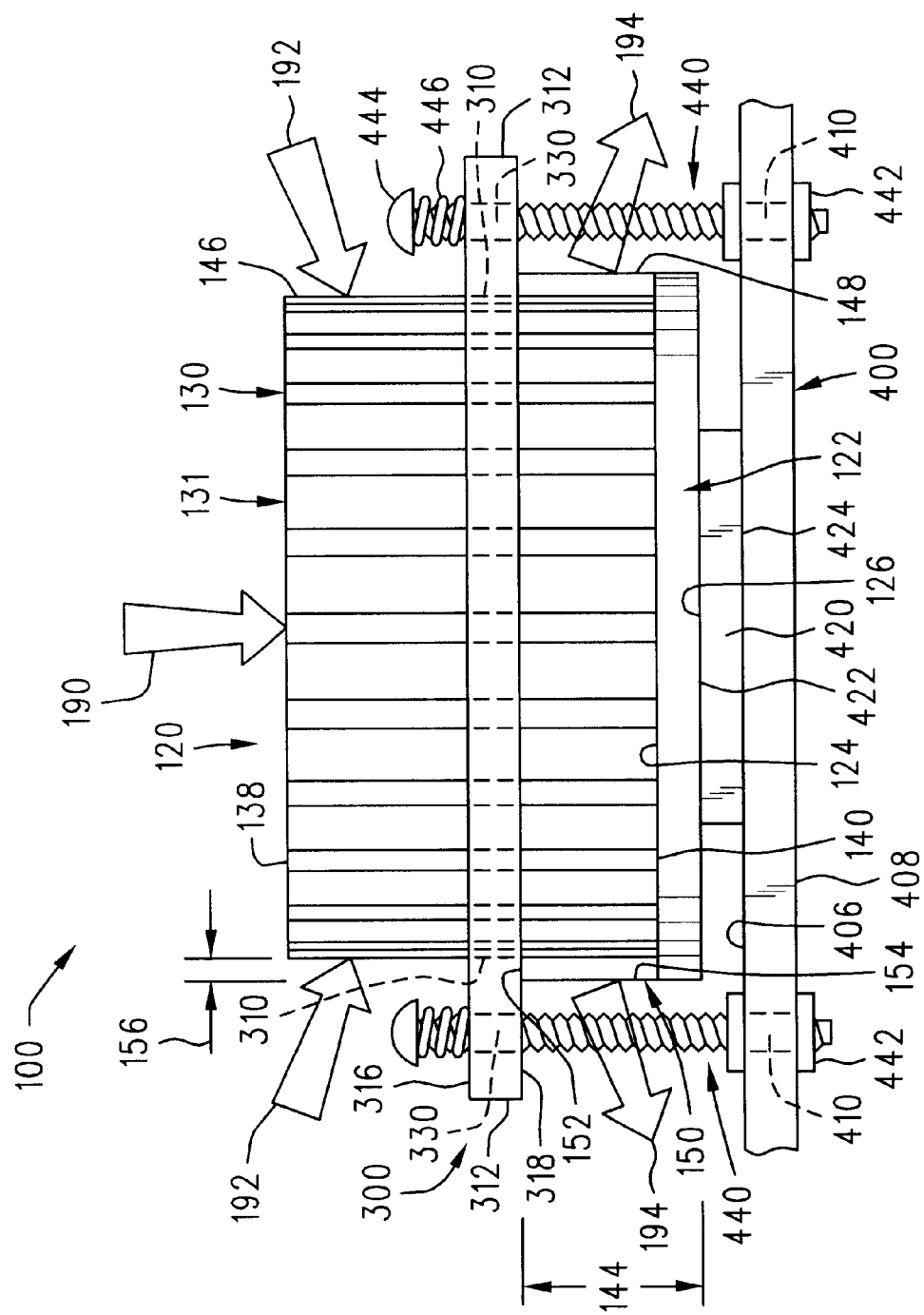
FIG. 3 is a side view of a further embodiment of the cooling device illustrated in FIG. 1.
Figure 4:
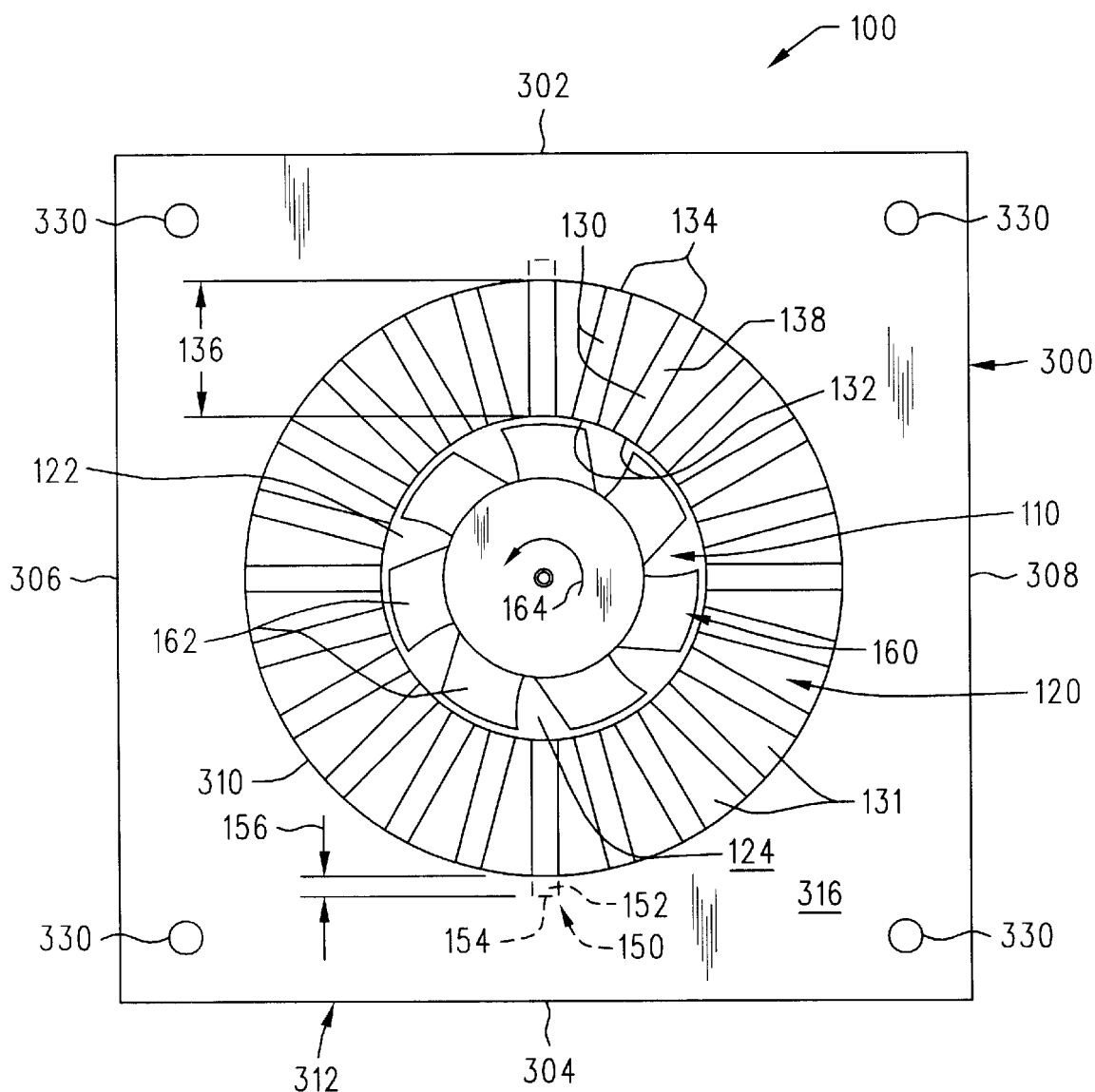
FIG. 4 is a top view of the cooling device of FIG. 3.

The air diverter 300 and heat sink 120 illustrated in FIGS. 1 and 2 have been illustrated as being a single, integrally formed unit. For example, they may be integrally formed during manufacturing or they may be permanently attached to each other after manufacturing. This may be achieved by casting the air diverter 300 and heat sink 120 as a single unit or casting them as separate components and welding or pressing them together. FIGS. 3 and 4, on the other hand, illustrate an embodiment of the cooling device 100 wherein the heat sink 120 and the air diverter 300 are separate components. FIG. 3 is a side view of the cooling device 100 similar to FIG. 1 and FIG. 4 is a top view of the cooling device 100 similar to FIG. 2. In the embodiment, the air diverter 300 fits over the heat sink 120 and is held in place my support members formed therein as described below.

At least two of the fins 130 have support portions 150 (sometimes referred to herein as shoulders) formed therein that serve to support the air diverter 300 relative to the heat sink 120. The lower portions 148 of the fins 130 with the support portions 150 formed therein extend a distance 156 beyond the upper portions 146. These extensions form support surfaces 152 that are used to support the air diverter 300 as described below. The support surfaces 152 are substantially parallel to the top portion 124 of the heat sink 120 and cumulatively define a plane. As with the embodiment of FIG. 1, the support surfaces 152 are located the distance 144 from the base portion 122. Support edges 154 extend vertically between the support surfaces 152 and the base portion 122.

In this embodiment, the air diverter 300 fits over the heat sink 120 so that the bottom surface 318 of the air diverter 300 sets on the support surfaces 152. Accordingly, the inner perimeter 310 of the air diverter 300 is slightly larger than the exterior peripheral wall the outer sides 134 of the fins 130 and, thus, the inner perimeter 310 remains adjacent the outer sides 134 of the fins 130. As with the previous embodiment, a spring force created by the compression of the springs 446 may be employed to secure the heat sink 120 to the integrated circuit 420.

This embodiment may offer advantages in that the cooling device 100 is comprised of two separate components. These separate components are fairly simple to manufacture relative to the welded or integrally formed cooling device 100 illustrated in FIG. 1. Thus, the cost of manufacturing this embodiment of the cooling device 100 may be reduced.

Figure 5:
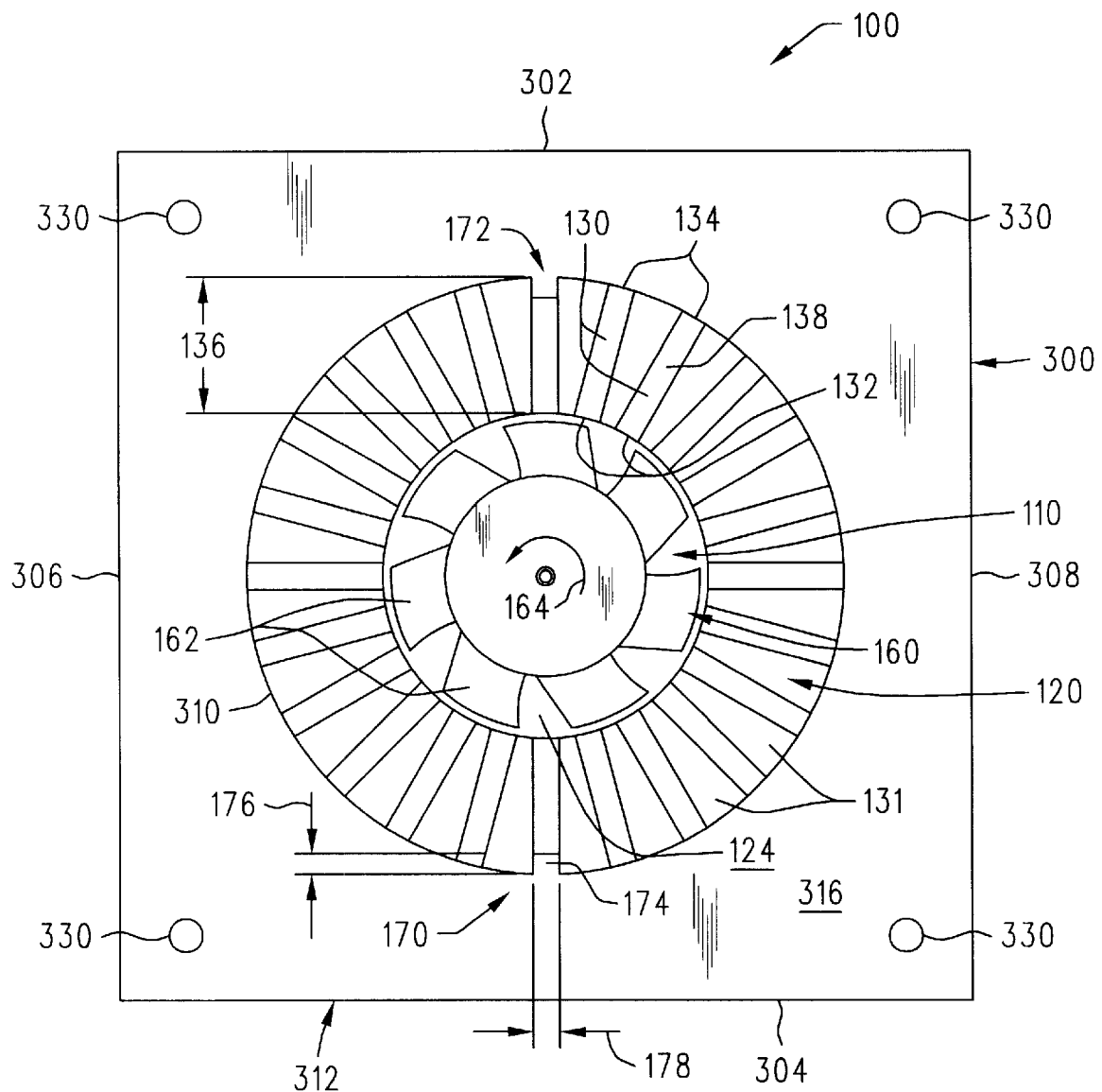
FIG. 5 is a top view of another embodiment of the cooling device illustrated in FIG. 1.

FIG. 5 illustrates a top view of an embodiment of the cooling device 100 that is similar to the embodiment illustrated in FIGS. 2 and 4. In this embodiment, the air diverter 300 has a first tab 170 and a second tab 172 formed therein. The tabs 170, 172 extend inward a distance 176 from the inner perimeter 310, thus forming surfaces 174. Two fins 130 corresponding to the locations of the tabs 170, 172 are formed so that the upper portions 146 of the fins 130, FIG. 1, are recessed inward toward the heat sink 120 relative to the lower portions 148. Accordingly, support surfaces or shoulders, not shown, are formed on these fins. The tabs 170, 172 set on these support surfaces in a similar manner as the described in the previous embodiment. The same means of securing the cooling device 100 to the printed circuit board 400 as illustrated above.

Figure 6:
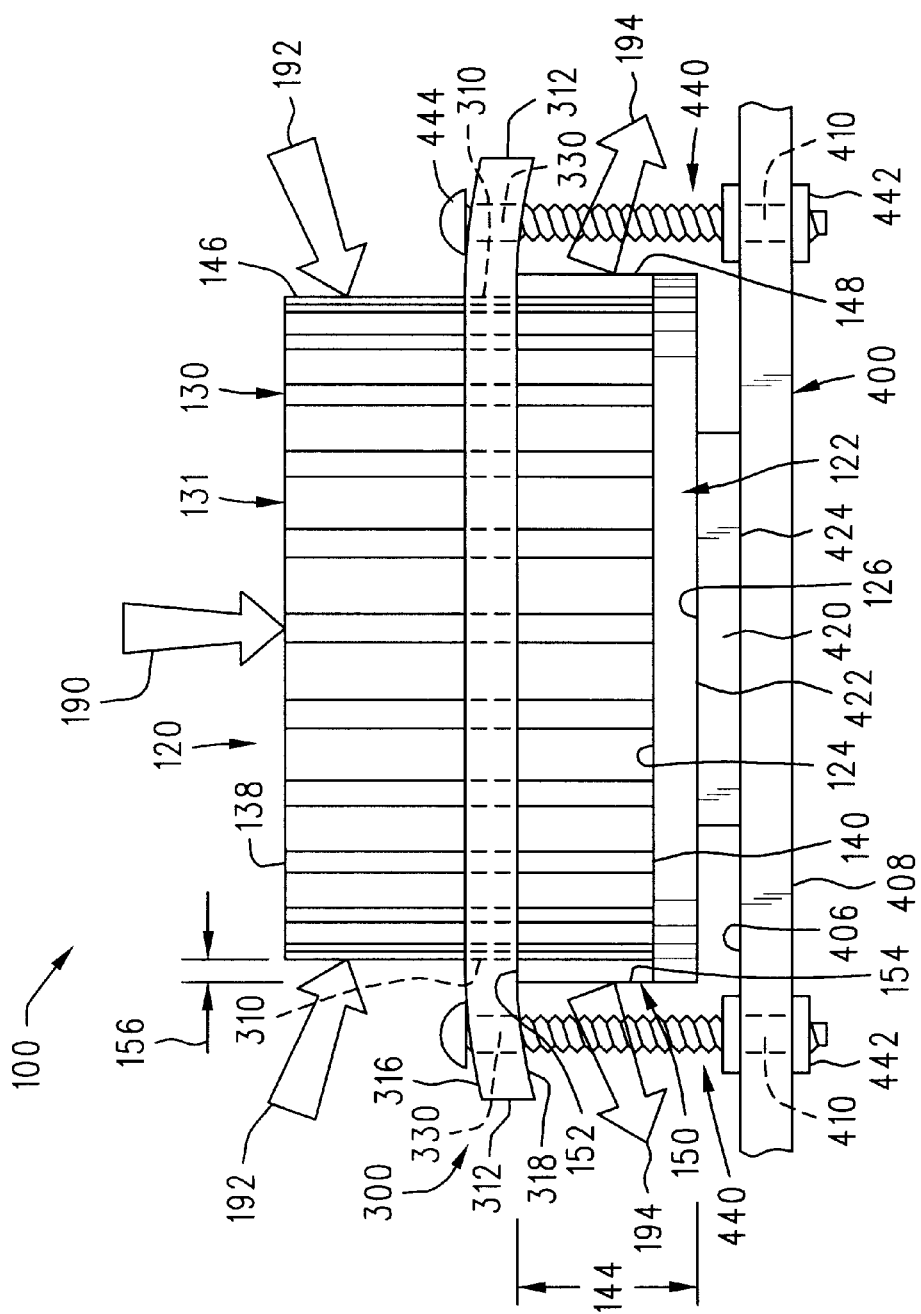
FIG. 6 is a side view of an embodiment of the cooling device of FIG. 1 wherein the cooling device has a flexible air diverter.

As described above, the springs 446 may be substituted for other devices that create spring forces. For example, FIG. 6 illustrates an embodiment of the cooling device 100 wherein the air diverter 300 is fabricated from a flexible material. As the screws 440 are threaded onto the nuts 442, the heads 444 are forced onto the top surface 316 of the air diverter 300 causing the air diverter 300 to deflect. This deflection creates a spring force that acts to secure the heat sink 120 to the integrated circuit 420. Accordingly, the above-described problems associated with the heat sink 120 being rigidly attached relative to the integrated circuit 420 are alleviated. It should be noted that the deflection of the air diverter 300 illustrated in FIG. 6 has been greatly exaggerated for illustration purposes.

A further embodiment of the cooling device 100 illustrated in FIG. 6 may be used without the use of long screws 440. The air diverter 300 may be appropriately formed to contact the upper surface 406 of the printed circuit board 400 and connect directly thereto. For example, the air diverter 300 may bend to extend parallel to the lower portions 148 of the fins 130. The air diverter 300 may then bend to extend parallel to the printed circuit board 400 and to contact the printed circuit board 400. This allows control of the spring force exerted between the cooling device 100 and the integrated circuit 420 to be controlled by the shape of the air diverter 300 rather than by treading the nuts 442 onto the screws 440. Accordingly, this may reduce the time and complexity in attaching the cooling device 100 to the printed circuit board 400.

Figure 7:
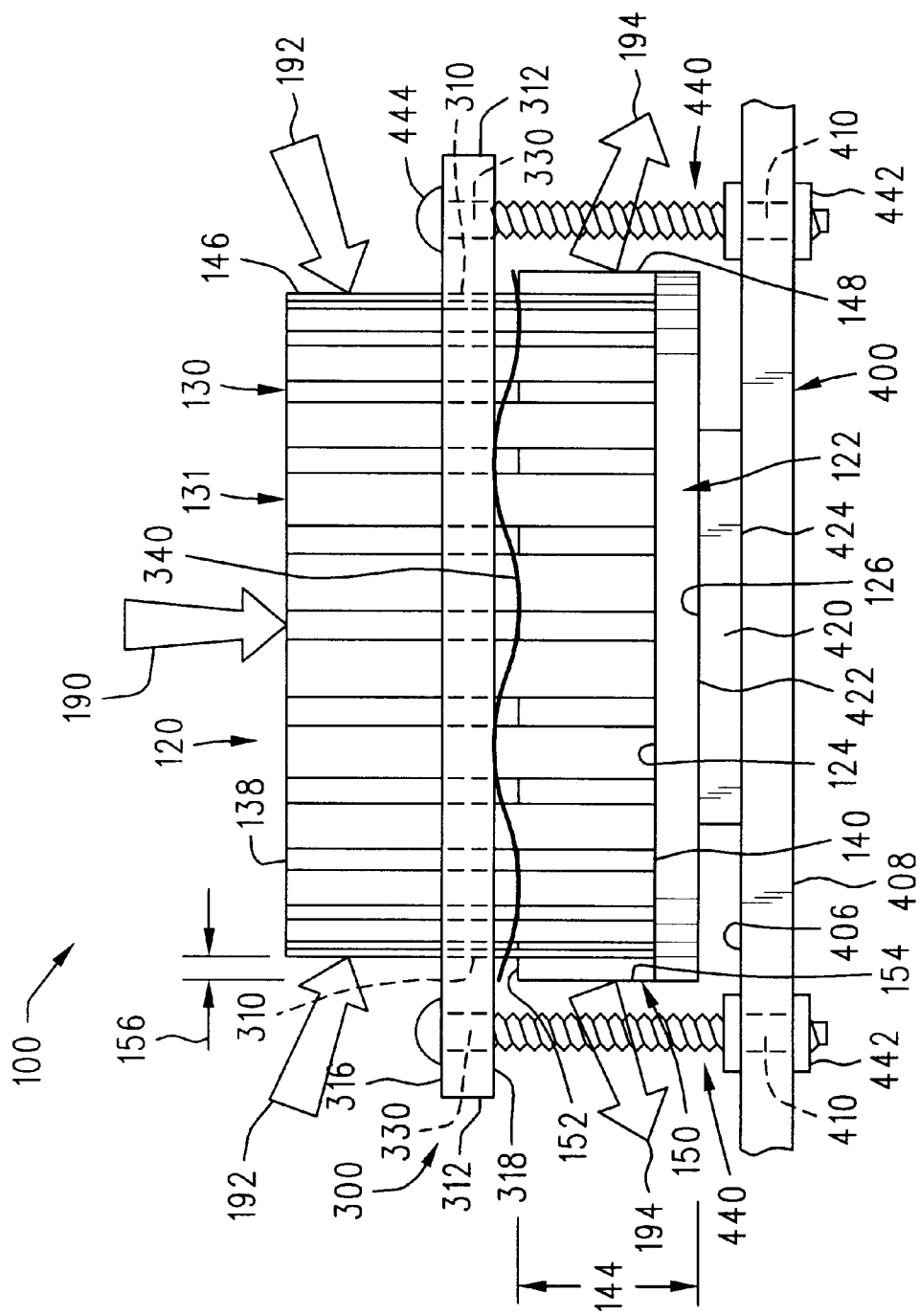
FIG. 7 is a side view of an embodiment of the cooling device of FIG. 1 wherein a spring washer is located between the heat sink and the air diverter.

Another example of a spring that may be used in the cooling device 100 is illustrated in FIG. 7. A spring 340 in the form of a spring washer may be positioned between the bottom surface 318 of the air diverter 300 and the support surfaces 152. The spring 340 alleviates the need for the springs 446 because the spring 340 provides the spring force between the heat sink 120 and the integrated circuit 420. Thus, the springs 446 may be removed. The function of the spring 340 is improved by increasing the number of fins 130 that have support surfaces 152 formed therein. The additional support surfaces serve to increase number of points where the spring 340 contacts the heat sink 120, thus, creating a more uniform and evenly divided spring force between the cooling device 100 and the integrated circuit 420.

The cooling device 100 has been described herein as being attached to the printed circuit board 400 to cool the integrated circuit 420. It is to be understood, however, that the description of the cooling device 100 associated with the integrated circuit 420 is for illustration purposes only and that the cooling device 100 may be used to cool other heat generating devices. Likewise, the air diverter has been described herein with respect to the heat sink 120. It is also to be understood that the air diverter 300 may, alternatively, be configured to be used in conjunction with virtually any heat sink configuration.

In addition, the outer perimeter 312 of the air diverter 300 has been illustrated as being square-shaped. It is to be understood that the outer perimeter 312 and, thus, the air diverter 300 may be a variety of shapes depending on the application of the cooling device 100.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

What is claimed is:

1. A cooling system for dissipating heat from a heat source, said cooling system comprising:
  a heat sink device including:
   a) a heat conductive base portion having a surface adapted to contact said heat source;
   b) a wall member extending from said heat conductive base portion;
   c) said wall member defining a chamber therewithin and a heat sink device exterior surface located on the opposite side of said wall member from said chamber;
   d) a plurality of openings through said wall member;
   e) said plurality of openings extending between said heat sink device exterior surface and said chamber;
  an intake airflow path extending from the heat sink device exterior through a first portion of said plurality of openings to said chamber;
  an exhaust airflow path extending from said chamber through a second portion of said plurality of openings to said heat sink device exterior; and a divider member including:
  a) a first surface facing said intake airflow path; and
  b) a second surface oppositely disposed relative to said first surface, said second surface facing said exhaust airflow path;
  wherein said divider member separates said intake and exhaust airflow paths; and
  wherein said device member extends from said heat sink exterior surface.

2. The cooling system of claim 1 wherein said intake airflow path is substantially parallel to said exhaust airflow path.

3. The cooling system of claim 1 wherein said divider member is integrally formed with said heat sink device.

4. The cooling system of claim 1 wherein said heat sink device exterior surface further includes a shoulder formed thereon and wherein said divider member abuts said shoulder.

5. The cooling system of claim 1 and further including a spring located between said heat sink device and said divider member.

6. The cooling system of claim 1 wherein:
  a plurality of heat conductive members extends from said heat conductive base portion;
  said wall member is formed by at least a portion of said plurality of heat conductive members; and
  each of said plurality of openings is located between two of said plurality of heat conducting members.

7. The cooling system of claim 1 wherein said divider member first surface is substantially parallel to said divider member second surface.

8. The cooling system of claim 1 wherein said divider member is flexible.

9. The cooling system of claim 1 further comprising a spring mechanism operationally associated between said divider member and said heat source.

10. The cooling system of claim 9 wherein said spring mechanism comprises a screw associated with a spring; wherein said screw has a shaft and a head, said shaft passing through said divider member and operationally associated with said heat source, said head located proximate said divider member first surface; and wherein said spring is located between said screw head and said divider member first side so as to bias said divider member toward said heat source.

11. A method of dissipating heat from a heat source, said method comprising:
  providing a heat sink device including:
    a) a heat conductive base portion having a surface adapted to contact said heat source;
    b) a wall member extending from said heat conductive base portion;
    c) said wall member defining a chamber therewithin and a heat sink device exterior surface located on the opposite side of said wall member from said chamber;
    d) a plurality of openings extending through said wall member;
    e) said plurality of openings extending between said heat sink device exterior surface and said chamber;
  conducting heat from said heat source through said heat conductive base portion and into said wall member;
  removing heat from said wall member by moving air along an intake airflow path into said heat sink device chamber from the heat sink device exterior through a first portion of said plurality of openings;
  removing additional heat from said wall member by moving air along an exhaust airflow path out of said heat sink device chamber through a second portion of said plurality of openings to said heat sink device exterior;
  providing a divider member including:
    a) a first surface facing said intake airflow path;
    b) a second surface oppositely disposed relative to said first surface, said second surface facing said exhaust airflow path; and
    wherein said divider member extends from said heat sink exterior surface;
  separating said intake and exhaust airflow paths with said divider member.

12. The method of claim 11 wherein said intake airflow path is substantially parallel to said exhaust airflow path.

13. The method of claim 11 wherein said divider member is integrally formed with said heat sink device.

14. The method of claim 11 wherein said heat sink device further includes a shoulder formed thereon and said divider member abuts said shoulder.

15. The method of claim 11 and further including a spring located between said heat sink device and said divider member.

16. The method of claim 11 wherein:
  a plurality of heat conductive members extends from said heat conductive base portion;
  said wall member is formed by at least a portion of said plurality of heat conductive members; and
  each of said plurality of openings is located between two of said plurality of heat conducting members.

17. The method of claim 11 and further including holding said heat sink device in contact with said heat source with said divider member.

18. The method of claim 17 wherein said heat source is attached to a substrate and said holding said heat sink device in contact with said heat source comprises attaching said divider member to said substrate.

19. The method of claim 11 wherein said divider member first surface is substantially parallel to said divider member second surface.

20. An attachment mechanism for securing a cooling device to a substrate wherein said cooling device is of the type comprising a base portion adapted to contact a heat source, said base portion having a plurality of heat conductive members extending from said base portion, said plurality of heat conductive members arranged to form a wall of said cooling device, said wall having an exterior surface;
  said attachment mechanism comprising:
    a divider member having a first surface and a second surface opposite said first surface;
    said divider member having a cutout between said first surface and said second surface, said cutout having a perimeter that is substantially the same shape as said wall exterior surface, wherein said perimeter has a size greater than said wall exterior surface; and
  wherein said divider member is adjacent said wall exterior surface; and
  wherein said divider member extends from said heat sink exterior surface.

21. The mechanism of claim 20 wherein said divider member is fabricated from a flexible material.

22. The mechanism of claim 20 wherein said divider member is fabricated from a material that deflects.

23. The mechanism of claim 20 further comprising a spring mechanism operationally associated with said divider member and said base portion so as to bias said base portion on an axis normal to said base portion.

24. The mechanism of claim 20 and further comprising a spring mechanism positioned between said wall exterior surface and said divider member.

* * * * *